US008497564B2

(12) United States Patent
Chen et al.

(10) Patent No.: US 8,497,564 B2
(45) Date of Patent: Jul. 30, 2013

(54) METHOD FOR FABRICATING A DECOUPLING COMPOSITE CAPACITOR IN A WAFER AND RELATED STRUCTURE

(75) Inventors: Xiangdong Chen, Irvine, CA (US); Wei Xia, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 317 days.

(21) Appl. No.: 12/583,016

(22) Filed: Aug. 13, 2009

(65) Prior Publication Data
US 2011/0037144 A1 Feb. 17, 2011

(51) Int. Cl.
*H01L 29/92* (2006.01)
*H01L 21/02* (2006.01)

(52) U.S. Cl.
USPC .......................................................... 257/532

(58) Field of Classification Search
USPC .......................................................... 257/532
See application file for complete search history.

(56) References Cited

U.S. PATENT DOCUMENTS

| 5,016,087 | A  | * | 5/1991  | Haug et al. | 257/750 |
| 5,304,506 | A  | * | 4/1994  | Porter et al. | 438/394 |
| 5,851,868 | A  | * | 12/1998 | Kim | 438/238 |
| 6,762,107 | B2 | * | 7/2004  | Watanabe et al. | 438/393 |
| 6,800,930 | B2 | * | 10/2004 | Jackson et al. | 257/700 |
| 7,030,481 | B2 | * | 4/2006  | Chudzik et al. | 257/700 |
| 7,741,231 | B2 | * | 6/2010  | Horton et al. | 438/770 |
| 7,911,026 | B2 | * | 3/2011  | Binder et al. | 257/532 |
| 2005/0006688 | A1 | * | 1/2005 | Solo De Zaldivar | 257/306 |
| 2010/0019347 | A1 | * | 1/2010 | McLellan et al. | 257/532 |
| 2010/0213573 | A1 | * | 8/2010 | Han | 257/532 |
| 2010/0308435 | A1 | * | 12/2010 | Nowak et al. | 257/532 |
| 2010/0330797 | A1 | * | 12/2010 | Douriet et al. | 438/612 |

* cited by examiner

Primary Examiner — Matthew W Such
Assistant Examiner — Robert Carpenter
(74) Attorney, Agent, or Firm — Farjami & Farjami LLP

(57) ABSTRACT

According to an exemplary embodiment, a method for fabricating a decoupling composite capacitor in a wafer that includes a dielectric region overlying a substrate includes forming a through-wafer via in the dielectric region and the substrate. The through-wafer via includes a through-wafer via insulator covering a sidewall and a bottom of a through-wafer via opening and a through-wafer via conductor covering the through-wafer via insulator. The method further includes thinning the substrate, forming a substrate backside insulator, forming an opening in the substrate backside insulator to expose the through-wafer via conductor, and forming a backside conductor on the through-wafer via conductor, such that the substrate backside conductor extends over the substrate backside insulator, thereby forming the decoupling composite capacitor. The substrate forms a first decoupling composite capacitor electrode and the through-wafer via conductor and substrate backside conductor form a second decoupling composite capacitor electrode.

20 Claims, 12 Drawing Sheets

METHOD FOR FABRICATING A DECOUPLING COMPOSITE CAPACITOR IN A WAFER AND RELATED STRUCTURE

BACKGROUND OF THE INVENTION

1. Field of the Invention

The present invention generally relates to the field of semiconductors. More particularly, the invention relates to fabrication of capacitors in semiconductor wafers.

2. Background Art

Decoupling capacitors are commonly utilized to reduce electrical noise, such as switching noise, in electronic circuits. For example, decoupling capacitors can be utilized to reduce electrical noise, such as switching noise in electronic circuits integrated in semiconductor dies, such as large scale integrated (LSI) circuits. However, decoupling capacitors can compete with other circuit elements, such as semiconductor devices, for limited space on a semiconductor die.

Conventionally, Metal-Insulator-Metal (MIM) capacitors and Metal Oxide Semiconductor (MOS) capacitors have been utilized for decoupling capacitors in electronic circuits fabricated on semiconductor dies. However, decoupling MIM capacitors and MOS capacitors can consume a large amount of die space. Thus, by utilizing MIM capacitors and/or MOS capacitors as decoupling capacitors, the amount of die space available for other circuit elements, such as semiconductor devices, can be undesirably and significantly reduced.

SUMMARY OF THE INVENTION

A method for fabricating a decoupling composite capacitor in a wafer and related structure, substantially as shown in and/or described in connection with at least one of the figures, as set forth more completely in the claims.

DETAILED DESCRIPTION OF THE INVENTION

Figure 1A:
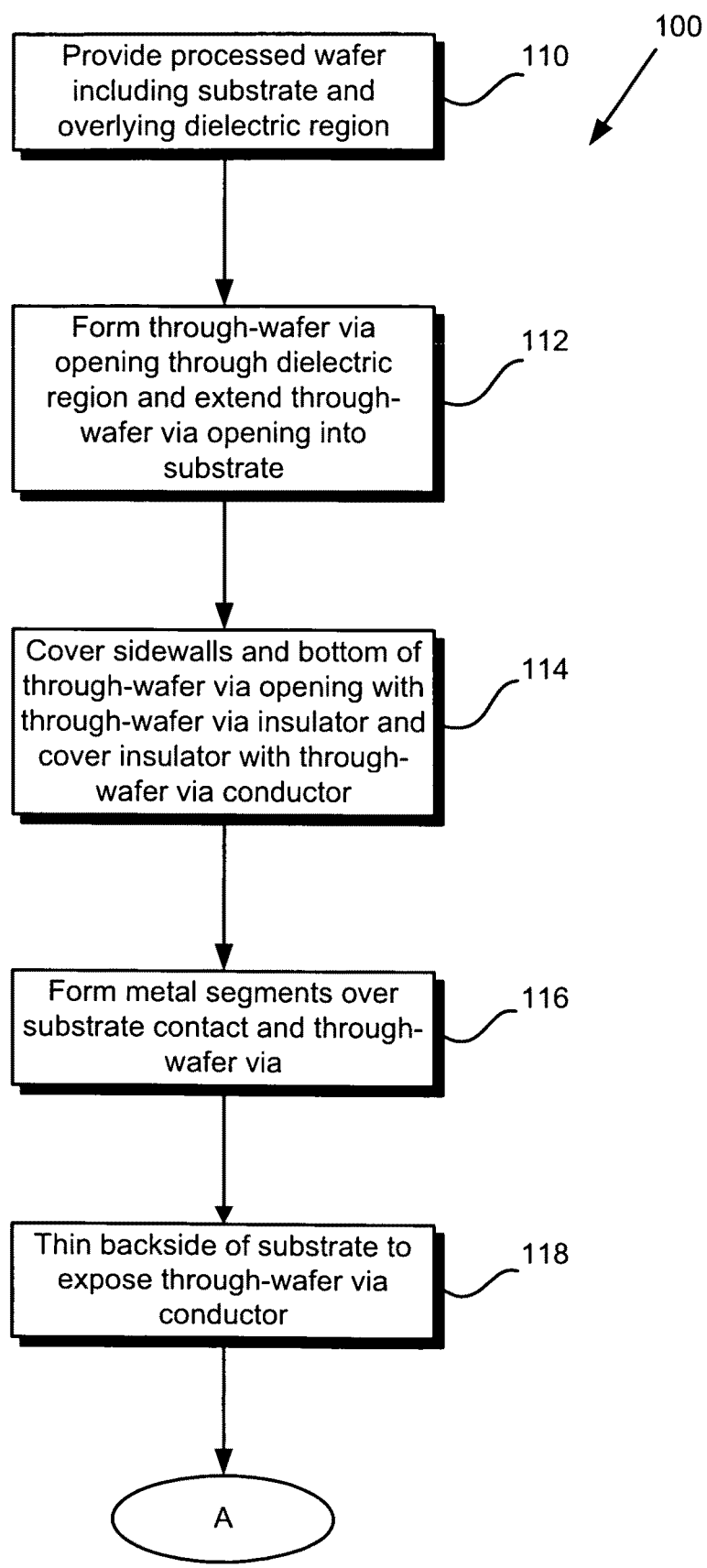
FIGS. 1A and 1B show a flowchart illustrating the steps taken to implement an embodiment of the present invention.

The present invention is directed to a method for fabricating a decoupling composite capacitor in a wafer and related structure. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

Figure 1B:
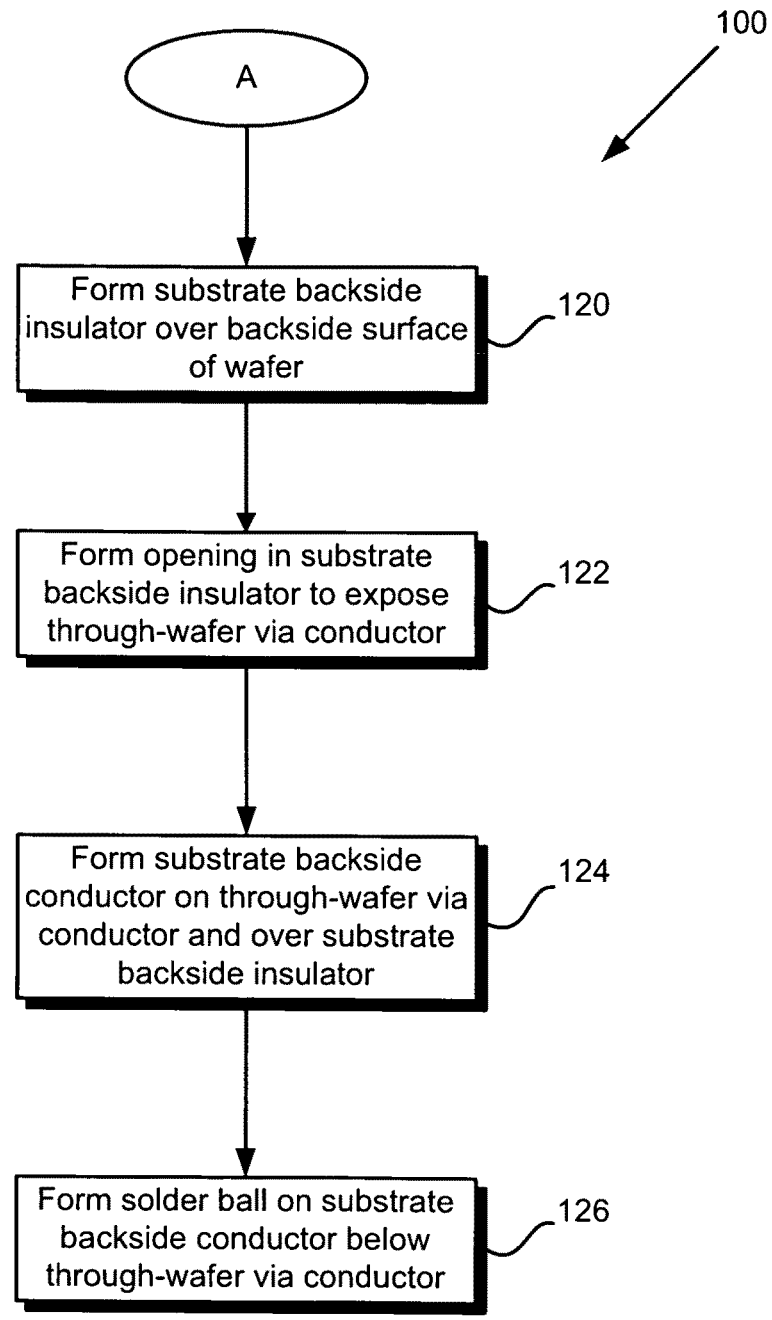

FIGS. 1A and 1B show a flowchart 100 illustrating an exemplary method, according to one embodiment of the present invention, for fabricating a decoupling composite capacitor structure in a processed wafer. Certain details and features have been left out of flowchart 100 that are apparent to a person of ordinary skill in the art. For example, a step may comprise one or more substeps or may involve specialized equipment or materials, as known in the art. Steps 110 through 126 indicated in flowchart 100 are sufficient to describe two embodiments of the present invention; however, other embodiments of the invention may utilize steps different from those shown in flowchart 100. It is noted that the processing steps shown in flowchart 100 are performed on a portion of a processed wafer, which, prior to step 110, includes, among other things, a substrate, a dielectric region, which can include at least one interlayer dielectric (ILD), and one or more semiconductor devices, such as bipolar transistors and/or CMOS devices. The processed wafer is also referred to simply as a wafer or a semiconductor die or simply a die in the present application.

Moreover, structures 210 through 226 in FIGS. 2A through 2I illustrate the result of performing steps 110 through 126 of flowchart 100, respectively. For example, structure 210 shows a semiconductor structure after processing step 110, structure 212 shows structure 220 after the processing of step 112, structure 214 shows structure 212 after the processing of step 114, and so forth. It is noted that the result of performing processing step 126 of flowchart 100 is also illustrated by structure 228 in FIG. 2J, which illustrates another embodiment of the invention.

Figure 2A:
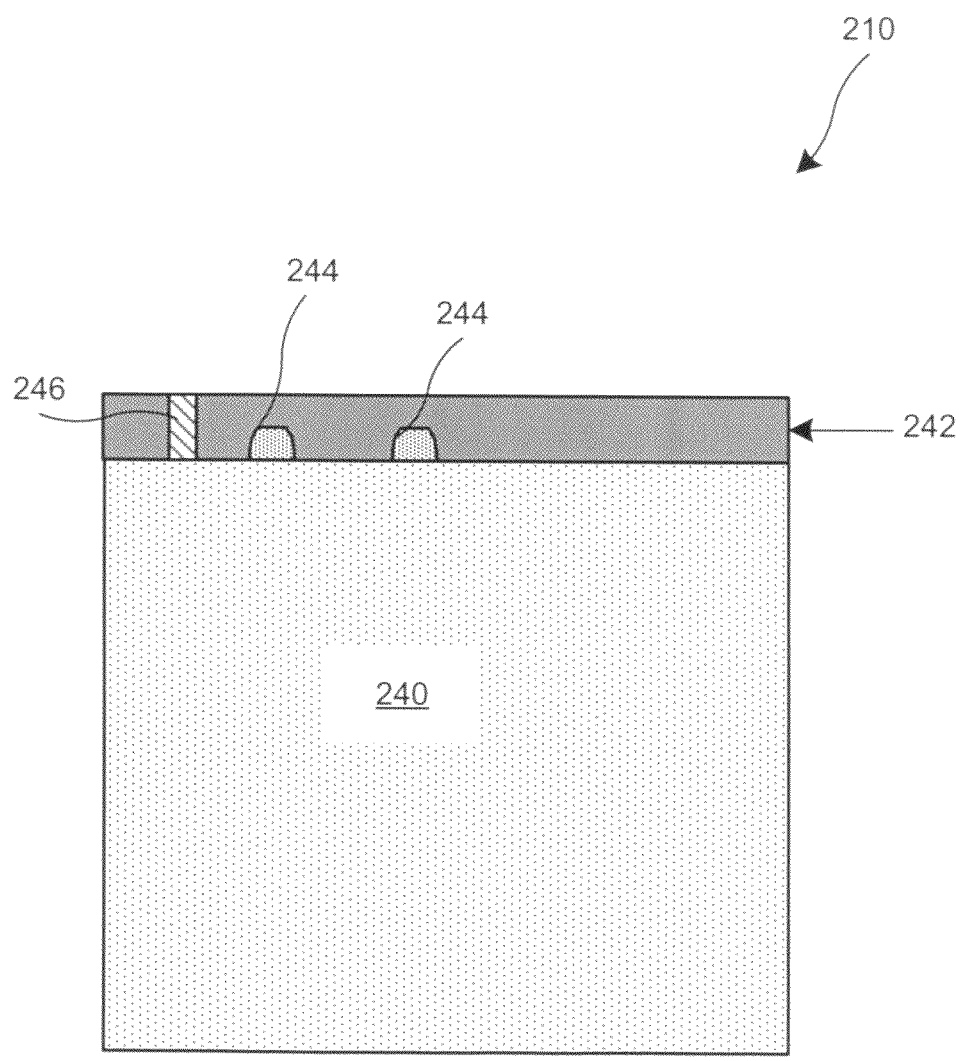
FIG. 2A illustrates a cross-sectional view, which includes a portion of a wafer processed according to an embodiment of the invention, corresponding to an initial step in the flowchart in FIG. 1A.

Beginning with step 110 of flowchart 100 in FIG. 1A, and structure 210 in FIG. 2A, at step 110 of flowchart 100, structure 210 is provided having substrate 240 with overlying dielectric region 242. Substrate 240 can comprise a heavily-doped semiconductor material, such as heavily-doped silicon. In one embodiment, substrate 240 can comprise P type heavily doped silicon (i.e., P+ silicon). In another embodiment, substrate 240 can comprise N type heavily doped silicon (i.e., N+ silicon). Dielectric region 242 is situated over substrate 240 and can include at least one interlayer dielectric, which can comprise silicon oxide or other suitable dielectric material.

As shown in FIG. 2A, semiconductor devices 244, such as, for example, bipolar transistors or CMOS devices, are situated over substrate 240 and covered by dielectric region 242. Also shown in FIG. 2A, substrate contact 246 extends through dielectric region 242 and is in electrical contact with the substrate 240. Substrate contact 246 can be electrically coupled to ground so as to provide a ground connection to substrate 240.

Figure 2B:
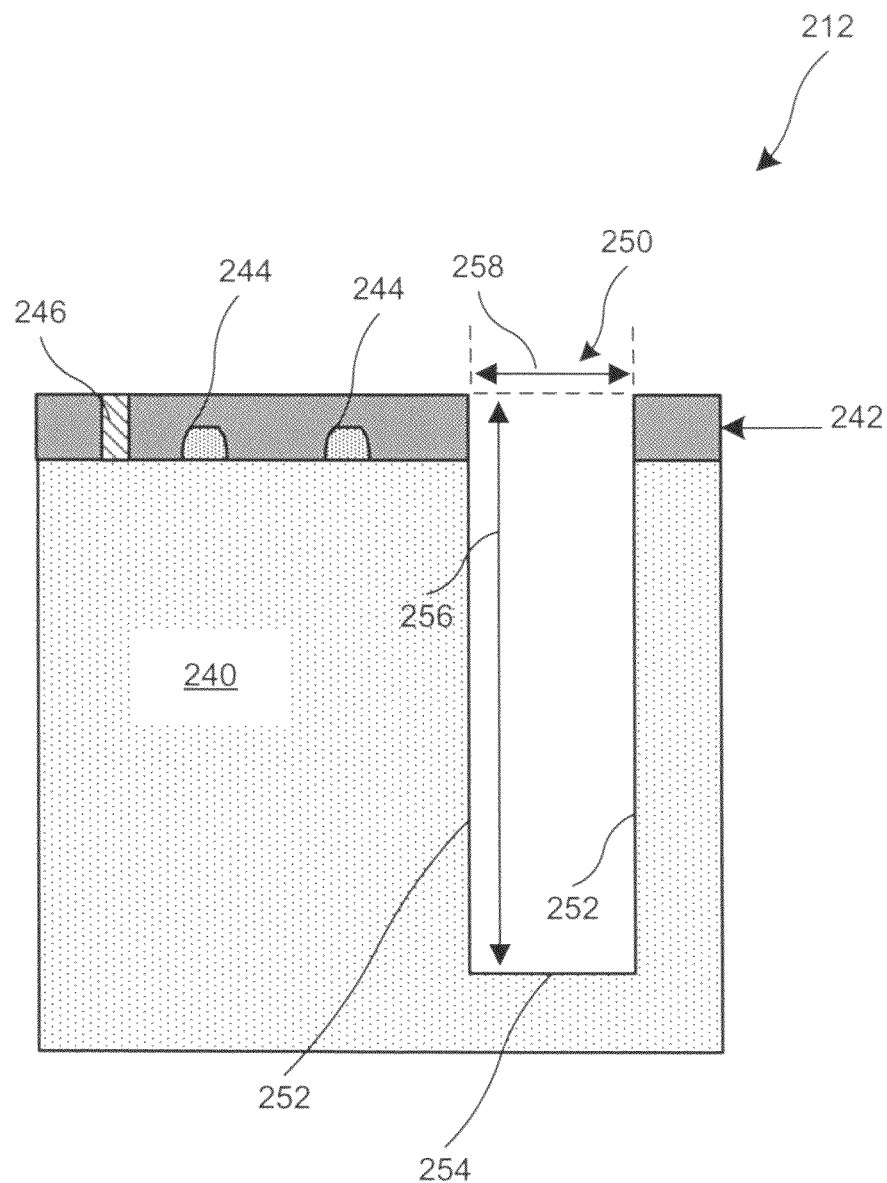
FIG. 2B illustrates a cross-sectional view, which includes a portion of a wafer processed according to an embodiment of the invention, corresponding to an intermediate step in the flowchart in FIG. 1A.

Referring to step 112 in FIG. 1A and structure 212 in FIG. 2B, at step 112 of flowchart 100, through-wafer via opening 250 is formed through the dielectric region 242 and extended into substrate 240. In an embodiment of the invention, through-wafer via opening 250 extends partially through substrate 240. Through-wafer via opening 250 has sidewalls 252, bottom surface 254, width 258, and depth 256. Width 258 can be, for example, approximately 20.0 to approximately 200.0 microns (µm). Depth 256 can be, for example, approximately 50.0 microns to approximately 100.0 microns in an embodiment of the invention. Through-wafer via opening 250 can be formed, for example, by utilizing a reactive ion etching (RIE) process or other etching process to etch through dielectric region 242 and into substrate 240. By utilizing an RIE process, through-wafer via opening 250 can have substantially vertical sidewalls (i.e. sidewall 252 can be substantially perpendicular to the top surface of substrate 240.

Figure 2C:
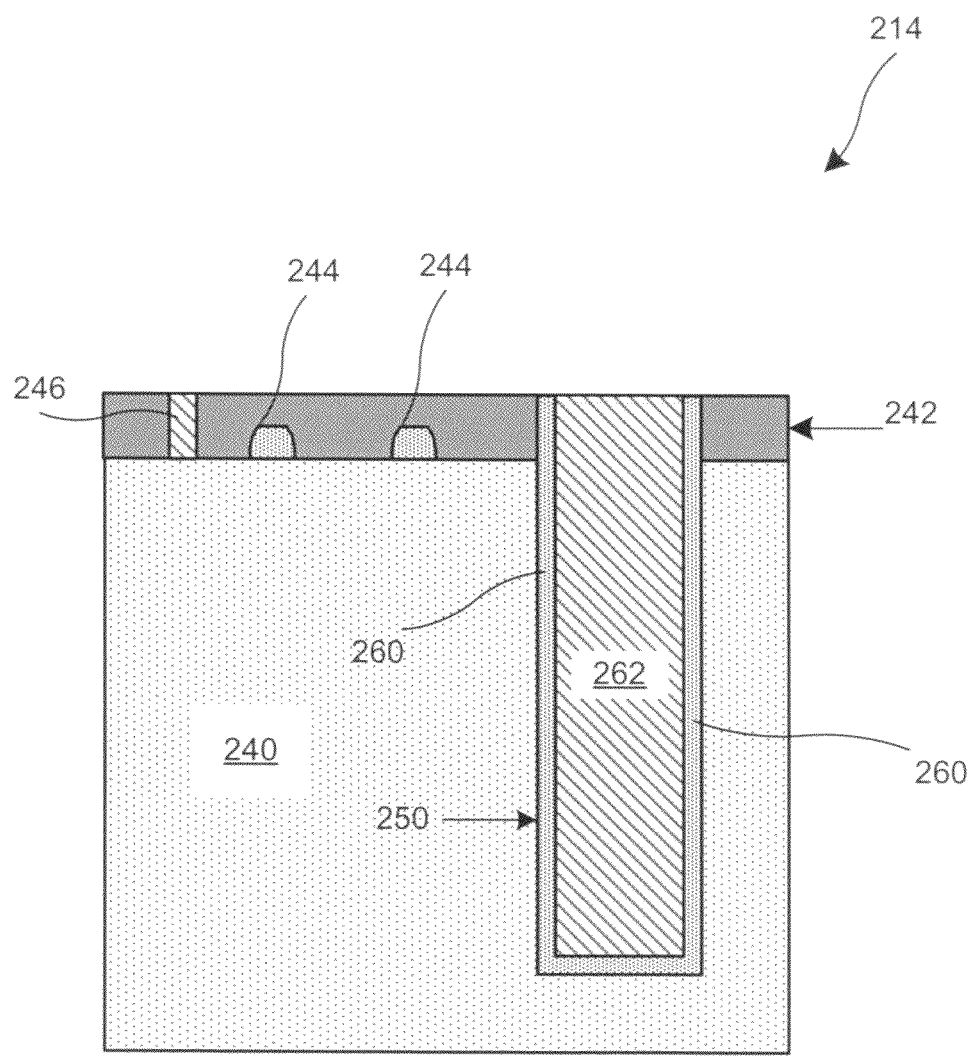
FIG. 2C illustrates a cross-sectional view, which includes a portion of a wafer processed according to an embodiment of the invention, corresponding to an intermediate step in the flowchart in FIG. 1A.

Referring to step 114 of FIG. 1A and structure 214 of FIG. 2C, at step 114 of flowchart 100, sidewalls 252 and bottom surface 254 of through-wafer via opening 250 are covered through-wafer via insulator 260 and through-wafer via insulator 260 is covered with through-wafer conductor 262. Through-wafer via insulator 260 can electrically isolate through-wafer conductor 262 from substrate 240. Through-wafer via insulator 260 can comprise silicon oxide, silicon nitride, or other dielectric material. In one embodiment of the invention, through-wafer via insulator 260 can have a thickness of, for example, approximately 5.0 to approximately 30.0 nanometers (nm). Through-wafer via insulator 260 can be formed by using a chemical vapor deposition (CVD) process or other suitable deposition processes.

Through-wafer via conductor 262 can comprise, for example, copper, aluminum, or other metal or a metal stack. In one embodiment, through-wafer via conductor 262 can substantially fill through-wafer via opening 250. In another embodiment, through-wafer via conductor 262 can partially fill through-wafer via opening 250. Through-wafer via conductor 262 can be formed by using a physical vapor deposition (PVD) process, a CVD process, or other deposition process. Through-wafer via insulator 260 can electrically isolate through-wafer via conductor 262 from substrate 240, thereby enabling a capacitance to form between through-wafer via conductor 262 and substrate 240.

Figure 2D:
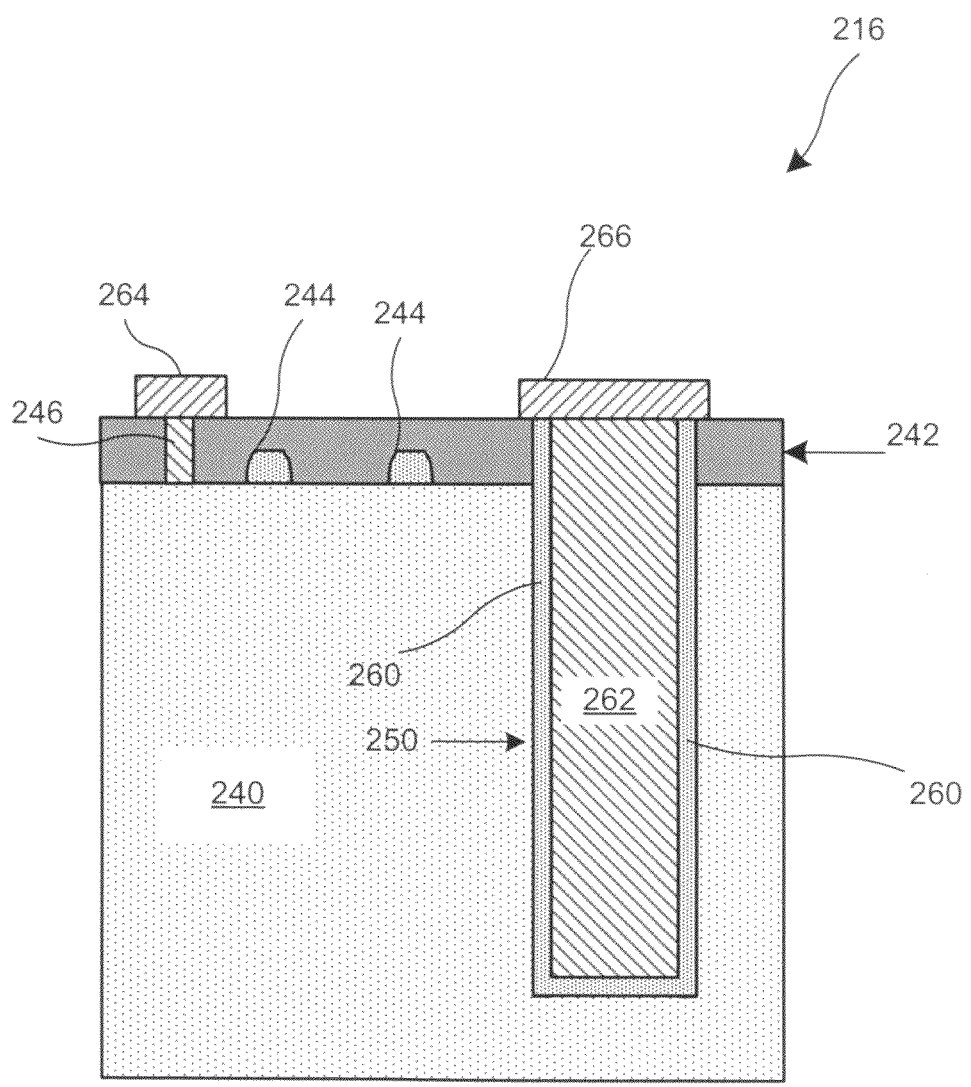
FIG. 2D illustrates a cross-sectional view, which includes a portion of a wafer processed according to an embodiment of the invention, corresponding to an intermediate step in the flowchart in FIG. 1A.

Referring to step 116 of FIG. 1A and structure 216 of FIG. 2D, at step 116 of flowchart 100, metal segments 264 and 266 are formed over substrate contact 246 and through-wafer via 250, respectively. Metal segment 264 is situated over and electrically connected to substrate contact 246 and metal segment 266 is situated over through-wafer via 270 and electrically connected to through-wafer via conductor 262. Metal segments 264 and 266 can comprise, for example, copper, aluminum, or other metal or a metal stack. Metal segments 264 and 266 can be formed, for example, by depositing a layer of metal, such as copper or aluminum, over dielectric region 242 by using a PVD process, a CVD process, or other suitable deposition process and appropriately patterning the metal layer.

Figure 2E:
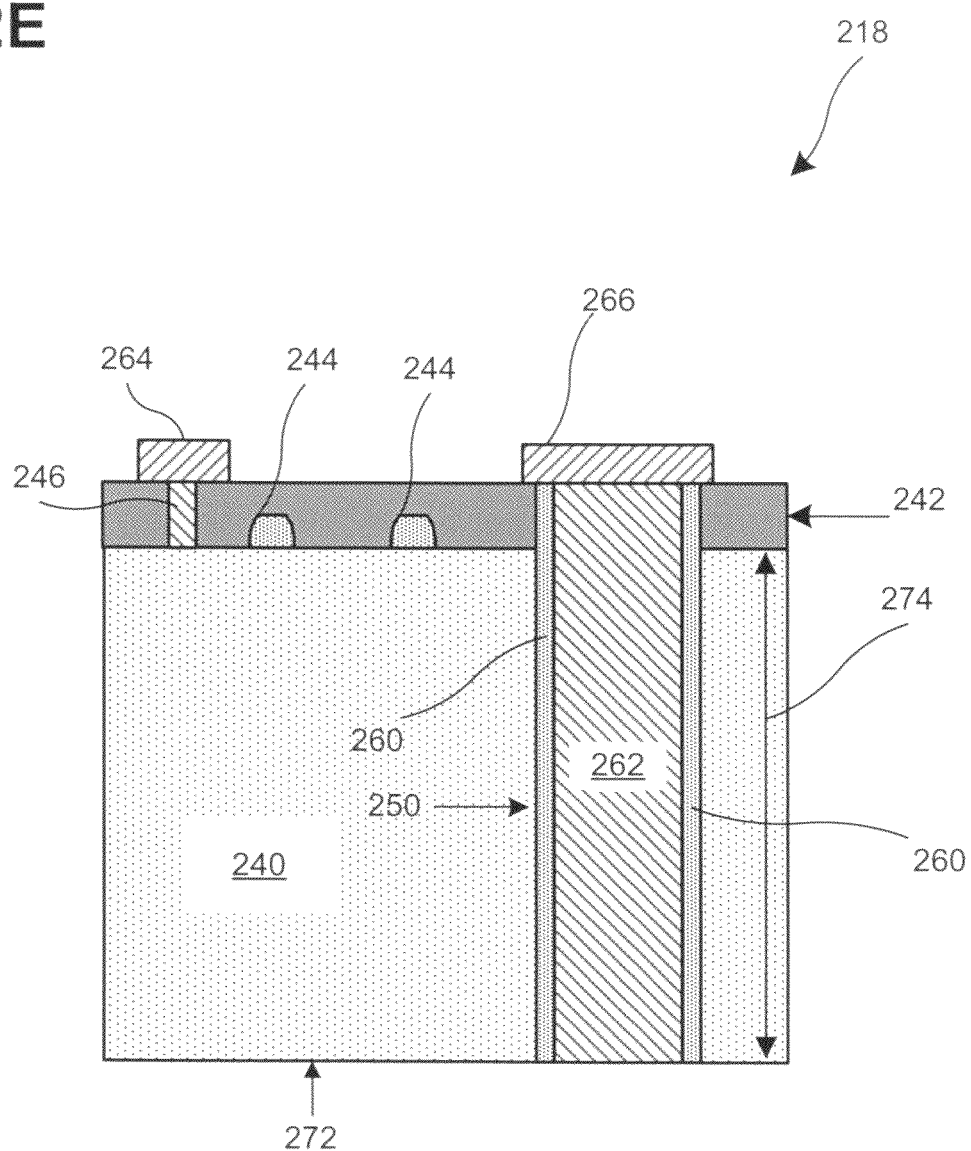
FIG. 2E illustrates a cross-sectional view, which includes a portion of a wafer processed according to an embodiment of the invention, corresponding to an intermediate step in the flowchart in FIG. 1A.

Referring to step 118 of FIG. 1A and structure 218 of FIG. 2E, at step 118 of flowchart 100, the backside of substrate 240 is thinned (i.e. reduced in thickness) in a thinning process to expose through-wafer via conductor 262. In addition to through-wafer via conductor 262, through-wafer via insulator 260 can also be exposed after the thinning process has been performed. During the thinning process, the thickness of the substrate is reduced from an initial thickness of a few hundred microns to final thickness 274, which can be, for example, approximately 50.0 microns to approximately 100.0 microns. In one embodiment, both through-wafer via insulator 260 and through-wafer via conductor 262 can protrude slightly from backside surface 272 of substrate 240 after the thinning process has been completed.

Substrate 240 can be reduced to final thickness 274 in a thinning process that can include, for example, a coarse silicon removal step and a fine silicon removal step. The coarse silicon removal step can be performed by utilizing a back-grinding process to reduce substrate 240 to a thickness close to final thickness 274. The fine silicon removal step can then be performed to reduce substrate 240 to final thickness 274 and to expose through-wafer via insulator 260 and through-wafer via conductor 262. The fine silicon removal step can be performed by utilizing a fine chemical mechanical polishing (CMP) process and/or an etch process, such as a suitable wet etch or dry etch process.

Figure 2F:
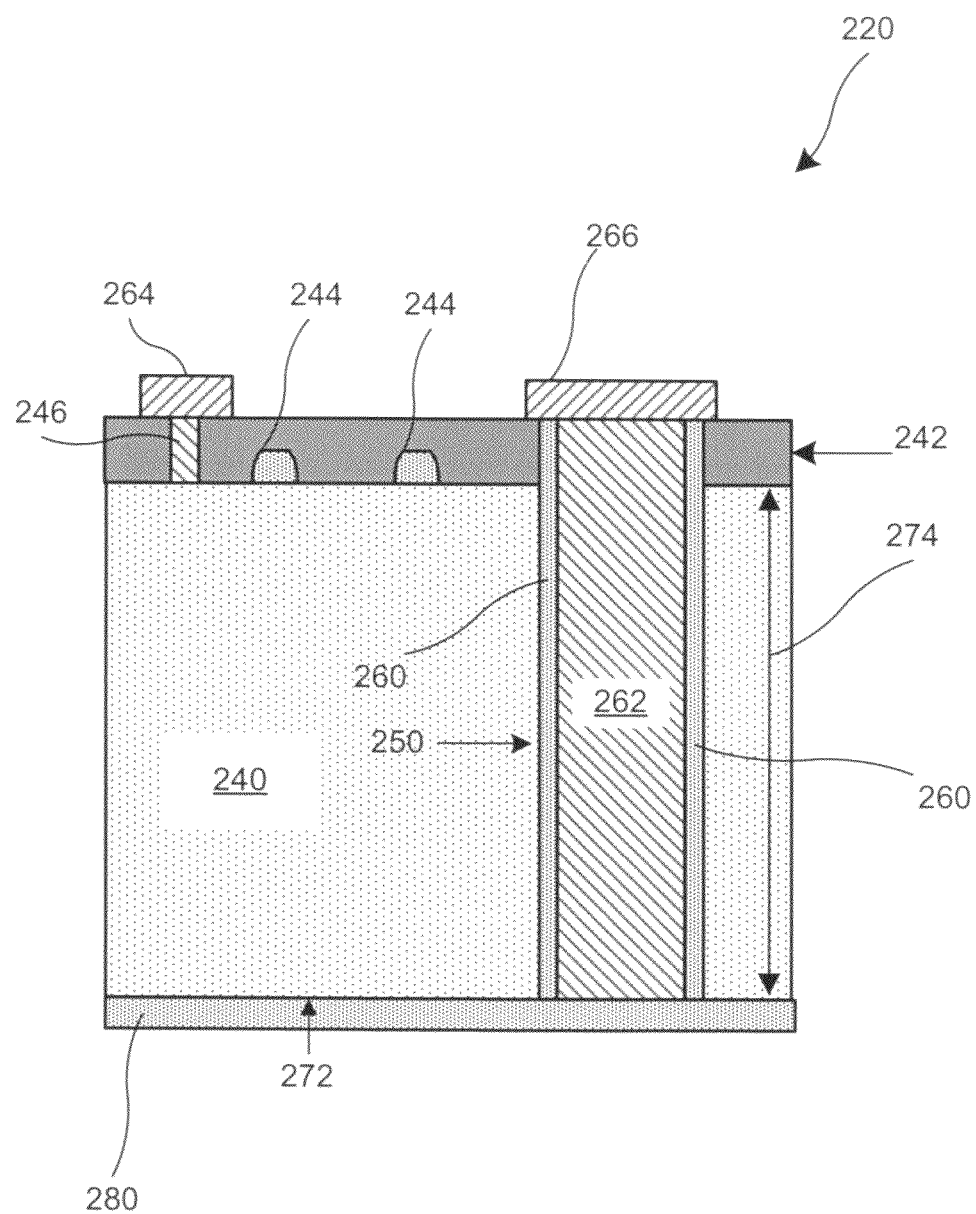
FIG. 2F illustrates a cross-sectional view, which includes a portion of a wafer processed according to an embodiment of the invention, corresponding to an intermediate step in the flowchart in FIG. 1B.

Referring to step 120 of FIG. 1B and structure 220 of FIG. 2F, at step 120 of flowchart 100, substrate backside insulator 280 is formed over backside surface 272 of substrate 240. Substrate backside insulator 280 can comprise, for example, silicon oxide, silicon nitride, or other dielectric material. In one embodiment of the invention, substrate backside insulator 280 can have a thickness of, for example, from approximately 5.0 to approximately 30.0 nm. Substrate backside insulator 280 can be formed by using a CVD process or other suitable deposition processes as known in the art.

Figure 2G:
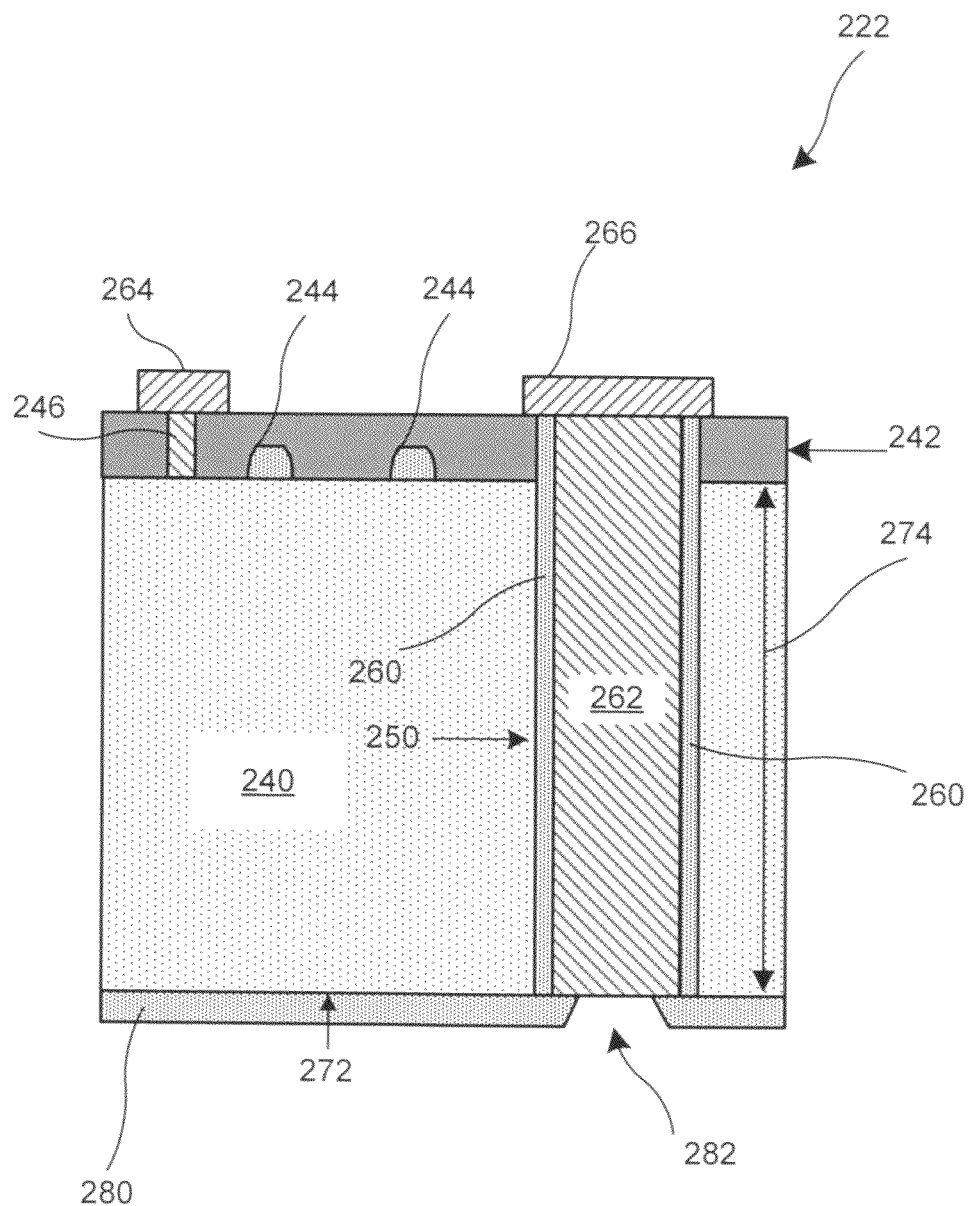
FIG. 2G illustrates a cross-sectional view, which includes a portion of a wafer processed according to an embodiment of the invention, corresponding to an intermediate step in the flowchart in FIG. 1B.

Referring to step 122 of FIG. 1B and structure 222 of FIG. 2G, at step 122 of flowchart 100, opening 282 is formed in substrate backside insulator 280 to expose through-wafer via conductor 262. Opening 282 can be formed in substrate backside insulator 280 by using an RIE process or other etching processes. In one embodiment of the invention, opening 282 can have sidewalls that are substantially perpendicular to backside surface 272 of substrate 240. In another embodiment, opening 282 can have sloped sidewalls. After opening 282 has been formed in substrate backside insulator 280, through-wafer via insulator 260 remains contiguous with substrate backside insulator 280.

Figure 2H:
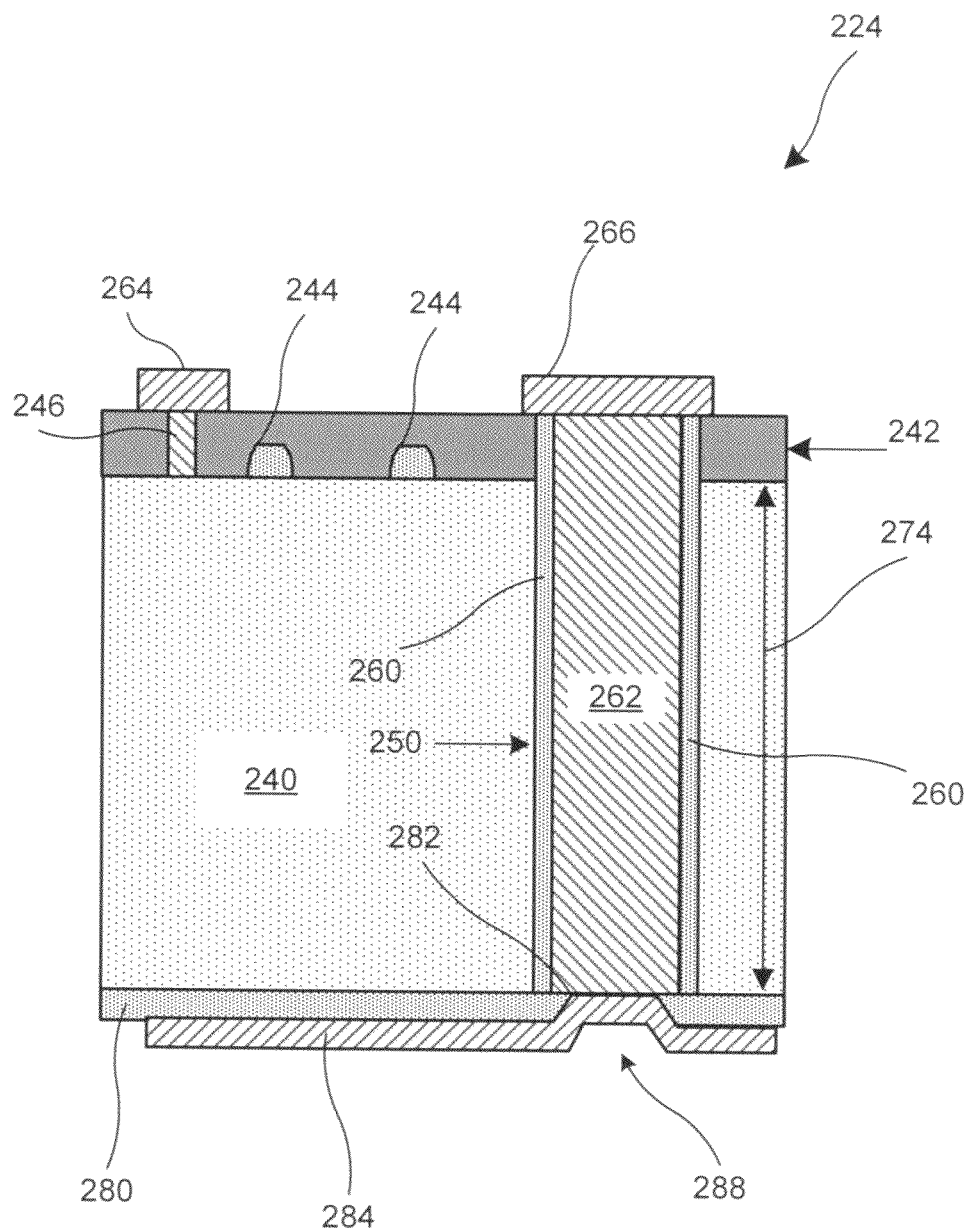
FIG. 2H illustrates a cross-sectional view, which includes a portion of a wafer processed according to an embodiment of the invention, corresponding to an intermediate step in the flowchart in FIG. 1B.

Referring to step 124 of FIG. 1B and structure 224 of FIG. 2H, at step 124 of flowchart 100, substrate backside conductor 284 is formed on through-wafer via conductor 262 and over substrate backside insulator 280. Substrate backside conductor 284, which is electrically connected to through-wafer via conductor 262, can comprise, for example, copper, aluminum, or other metal or a metal stack. Substrate backside conductor 284 can be formed, for example, by depositing a layer of metal, such as copper or aluminum, over substrate backside insulator 280 by using a PVD process, a CVD process, or other suitable deposition process and appropriately patterning the metal layer. Substrate backside insulator 280 electrically isolates substrate backside conductor 284 from substrate 240, thereby enabling a capacitance to form between substrate backside conductor 284 and substrate 240. Substrate backside conductor 284 can be, for example, an under bump metal (UBM) layer. In one embodiment, substrate backside conductor 284 can be a redistribution layer (RDL). Substrate backside conductor 284 can form depression 288 in opening 282 directly below through-wafer via conductor 262.

Figure 2I:
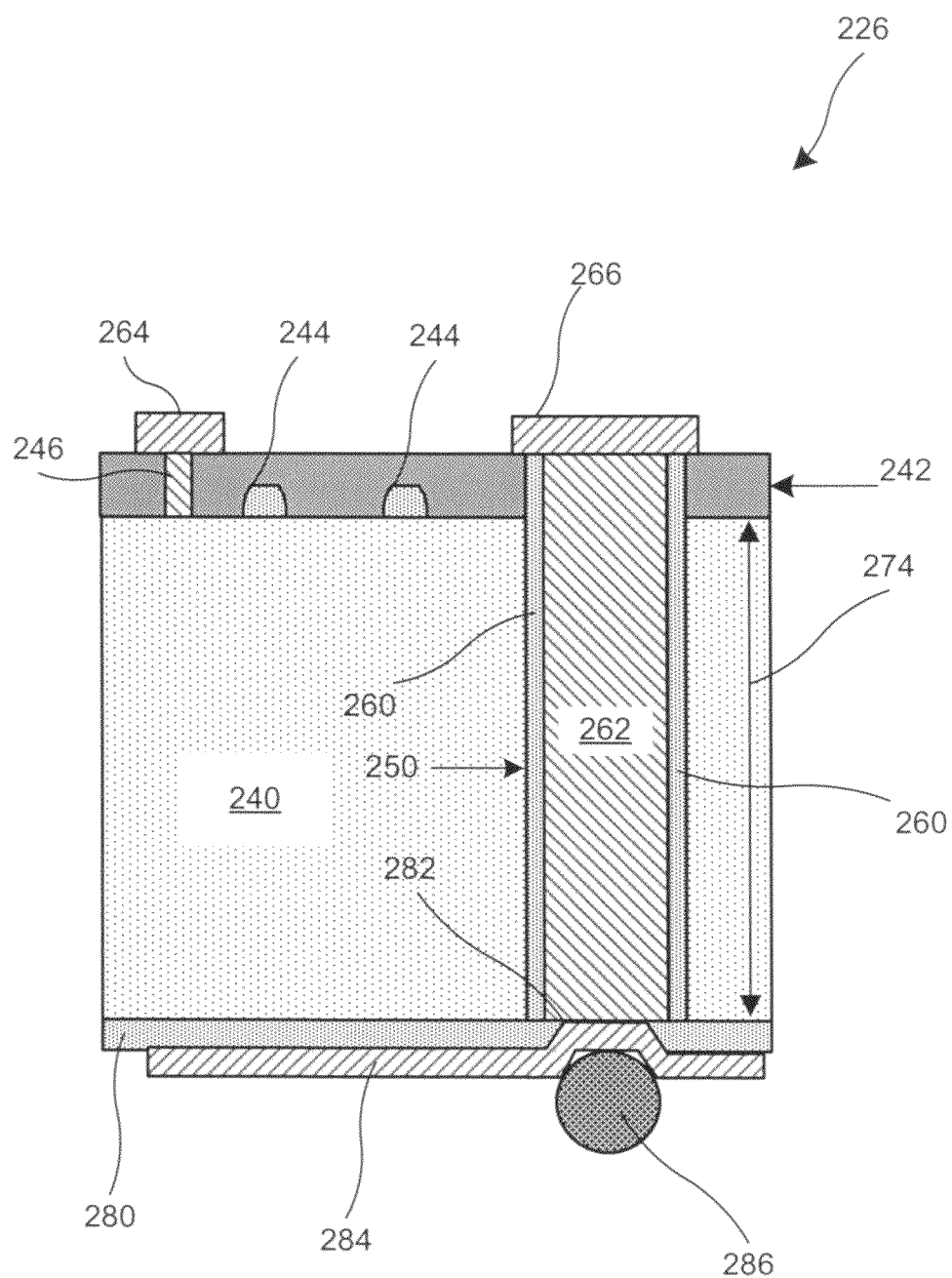
FIG. 2I illustrates a cross-sectional view, which includes a portion of a wafer processed according to an embodiment of the invention, corresponding to a final step in the flowchart in FIG. 1B.

Referring to step 126 of FIG. 1B and structure 226 of FIG. 2I, at step 126 of flowchart 100, solder ball 286 is formed on substrate backside conductor 284 in depression 288 (shown in FIG. 2H) below through-wafer via conductor 262. Solder ball 286 can comprise, for example, a metallic material, such as a metallic material having a low melting point. Solder ball 286 can electrically couple through-wafer via conductor 262 and substrate backside conductor 284 to a supply voltage, such as Vdd.

Figure 2J:
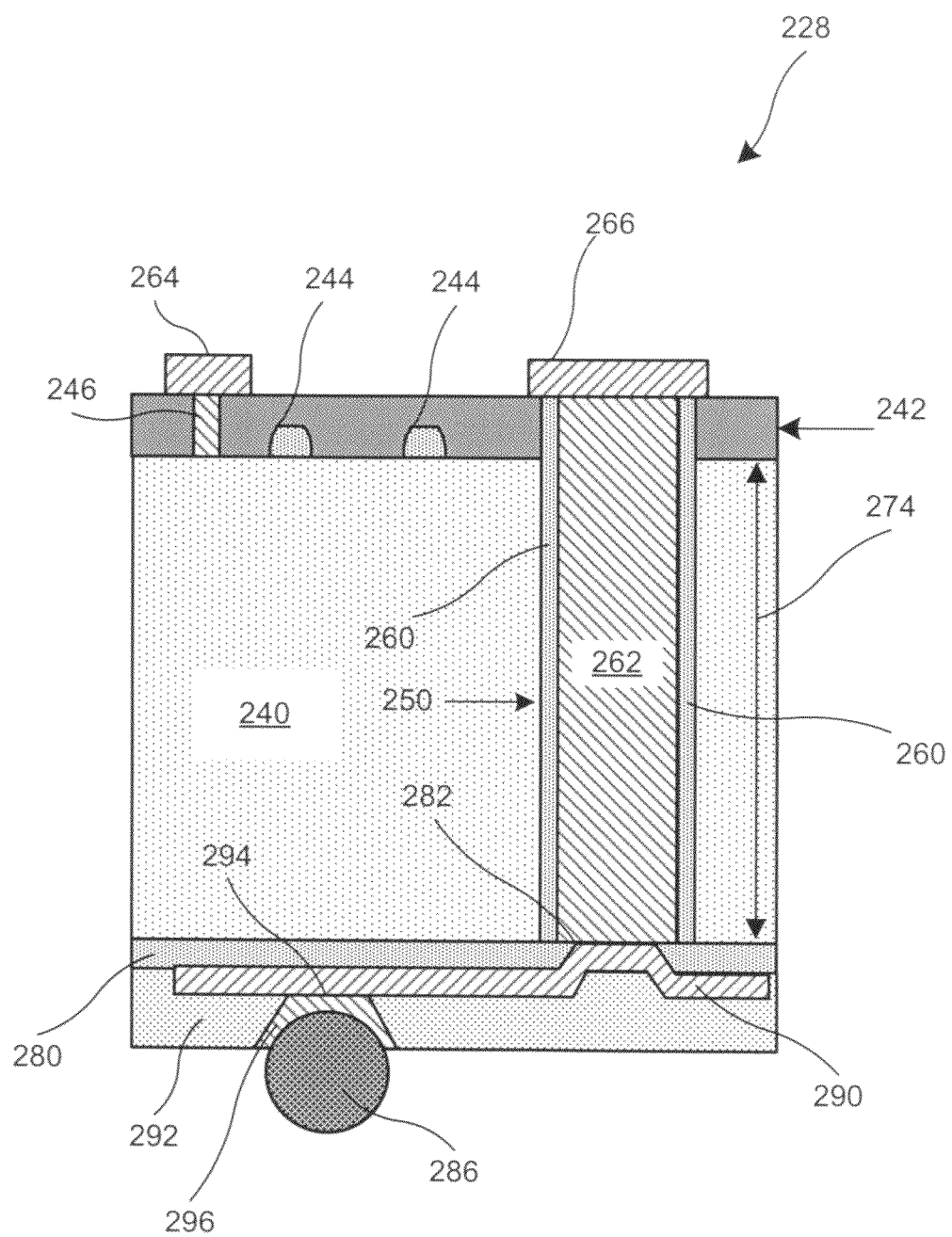
FIG. 2J illustrates a cross-sectional view, which includes a portion of a wafer processed according to another embodiment of the invention.

FIG. 2J shows a cross-sectional view of structure 228 in accordance with another embodiment of the invention. In the embodiment shown in FIG. 2J, a redistribution layer (i.e. redistribution layer 290) is utilized for substrate backside conductor 284. Structure 228 in FIG. 2J generally corresponds to structure 226 in FIG. 2I. Thus, to preserve brevity, only the differences between structure 228 and structure 226 will be discussed in detail herein. As shown in FIG. 2J, redistribution layer 290 is formed on through-wafer via conductor 262 and over substrate backside insulator 280, dielectric layer 292 is formed over redistribution layer 290, opening 294 is formed in dielectric layer 292, metal segment 296 is formed in opening 294, and solder ball 286 is formed on metal segment 296. Redistribution layer 290 can comprise copper, aluminum, or other metal or a metal stack and can be formed, for example, by utilizing a PVD process, a CVD process, or other suitable deposition process to deposition a layer of metal, such as aluminum or copper. The layer of metal can then be appropriately patterned in a manner known in the art.

Dielectric layer 292 can comprise, for example, silicon oxide or other dielectric material and can be formed by utilizing a CVD process or other deposition process. Opening 294 can be formed in dielectric layer 290 by utilizing an etching process, such as an RIE process or other etching process. Metal segment 296 can comprise copper, aluminum, or other metal and can be formed by utilizing a PVD process, a CVD process, or other suitable deposition process. Solder ball 286, which is electrically connected to redistribution layer 290 and through-wafer via conductor 262, can be formed on metal segment 296 in a manner known in the art.

Redistribution layer 290 can allow solder ball 286 to be laterally spaced apart from through-wafer via conductor 262 while maintaining electrical connectivity with through-wafer via conductor 262. Thus, solder ball 286 can be situated at any desired position along redistribution layer 290.

In an embodiment of the invention disclosed in flowchart 100, a decoupling composite capacitor can be formed, where the decoupling composite capacitor includes substrate 240, which can form a first electrode of the decoupling composite capacitor, and through-wafer via conductor 262 and substrate backside conductor 284, which can form a second electrode of the decoupling composite capacitor. Thus, through-wafer via conductor 262 can form one portion of the second decoupling composite capacitor electrode and substrate backside conductor 284 can form another portion of the second decoupling composite capacitor electrode. The decoupling composite capacitor also includes through-wafer via insulator 260, which electrically isolates substrate 240 from through-wafer via conductor 262, and substrate backside insulator 280, which electrically isolates substrate 240 from substrate backside conductor 284. Thus, through-wafer via insulator 260 and substrate backside insulator 280 can form a capacitor dielectric for the decoupling composite capacitor.

Substrate 240 can be electrically connected to ground via substrate contact 246 and substrate metal segment 266. Substrate 240 can be a heavily doped substrate, such as a heavily doped P type substrate, to provide increased conductivity. In one embodiment, substrate 240 can be a heavily doped N type substrate. Through-wafer via conductor 262 and substrate backside conductor 284 can be electrically connected to a supply voltage, such as Vdd, by solder ball 286. Thus, an embodiment of the invention's decoupling composite capacitor can be electrically connected between ground and the supply voltage, such as Vdd.

Advantageously, an embodiment of the invention's decoupling composite capacitor can have a capacitance ranging from approximately 10.0 to approximately 50.0 picofarads (pf). In one embodiment, the invention's decoupling composite capacitor can have a capacitance greater than approximately 50 pf. Also, an embodiment of the invention's decoupling composite capacitor advantageously consumes area on the backside of the die, which is typically not utilized for circuit elements. Thus, an embodiment of the invention's decoupling composite capacitor can provide a high capacitance while consuming minimal die area that is typically utilized for other circuit components, such as semiconductor devices. Further, an embodiment of the invention's decoupling composite capacitor can be formed by utilizing substantially the same process steps as utilized to form through-wafer vias, thereby advantageously providing a high capacitance decoupling capacitor at a reduced cost compared to conventional decoupling capacitors.

From the above description of the invention, it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A semiconductor die comprising one or more semiconductor devices and a decoupling composite capacitor, said decoupling composite capacitor comprising:
   a through-wafer via opening in a substrate of said semiconductor die, said through-wafer via opening having a sidewall covered by a through-wafer via insulator;
   a through-wafer via conductor covering said through-wafer via insulator;
   a substrate backside insulator overlying a bottom of said substrate;
   a substrate backside conductor in contact with said through-wafer via conductor through an opening in said substrate backside insulator, said substrate backside conductor comprising a depression at said opening, and extending over said substrate backside insulator, thereby forming said decoupling composite capacitor.

2. The semiconductor die of claim 1 wherein said substrate forms a first electrode of said decoupling composite capacitor.

3. The semiconductor die of claim 2 wherein said through-wafer via conductor and said substrate backside conductor form a second electrode of said decoupling composite capacitor.

4. The semiconductor die of claim 1 further comprising a solder ball situated on said substrate backside conductor, wherein said solder ball provides an electrical connection to said through-wafer via conductor.

5. The semiconductor die of claim 4 wherein said substrate backside conductor is an under bump metal layer.

6. The semiconductor die of claim 4 wherein said substrate backside conductor is a redistribution layer.

7. The semiconductor die of claim 1 wherein said substrate backside insulator is contiguous with said through-wafer via insulator.

8. The semiconductor die of claim 1 wherein said substrate is a heavily doped substrate.

9. The semiconductor die of claim 1 wherein said through-wafer via opening is approximately 20.0 to approximately 200.0 microns wide.

10. A semiconductor die comprising one or more semiconductor devices and a composite capacitor, said composite capacitor comprising:
   a through-wafer via opening in a substrate of said semiconductor die, said through-wafer via opening having a sidewall covered by a through-wafer via insulator;
   a through-wafer via conductor covering said through-wafer via insulator;
   a substrate backside insulator overlying a bottom of said substrate;
   a substrate backside conductor in contact with said through-wafer via conductor through an opening in said substrate backside insulator, said substrate backside conductor comprising a depression at said opening.

11. The semiconductor die of claim 10 wherein said substrate forms a first electrode of said composite capacitor.

12. The semiconductor die of claim 11 wherein said through-wafer via conductor and said substrate backside conductor form a second electrode of said composite capacitor.

13. The semiconductor die of claim 10 further comprising a solder ball situated on said substrate backside conductor, wherein said solder ball provides an electrical connection to said through-wafer via conductor.

14. The semiconductor die of claim 10 wherein said substrate backside conductor is an under bump metal layer.

15. The semiconductor die of claim 10 wherein said substrate backside conductor is a redistribution layer.

16. The semiconductor die of claim 15 wherein said redistribution layer comprises metal selected from the group consisting of copper, aluminum, a metal stack including copper, and a metal stack including aluminum.

17. The semiconductor die of claim 15 wherein said redistribution layer is formed by a deposition process selected from the group consisting of a PVD process and a CVD process.

18. The semiconductor die of claim 10 wherein said substrate backside insulator is contiguous with said through-wafer via insulator.

19. The semiconductor die of claim 10 wherein said substrate is a heavily doped substrate.

20. The semiconductor die of claim 10 wherein said through-wafer via opening is approximately 20.0 to approximately 200.0 microns wide.

* * * * *